United States Patent
Chen et al.

(10) Patent No.: US 8,304,911 B2
(45) Date of Patent: Nov. 6, 2012

(54) SEMICONDUCTOR STRUCTURE AND MANUFACTURING METHOD OF THE SAME

(75) Inventors: Shih-Hung Chen, Jhudong Township Hsinchu County (TW); Hang-Ting Lue, Hsinchu (TW); Yi-Hsuan Hsiao, Budai Township, Chiayi County (TW)

(73) Assignee: Macronix International Co., Ltd., Hsinchu (TW)

( * ) Notice: Subject to any disclaimer, the term of this patent is extended or adjusted under 35 U.S.C. 154(b) by 129 days.

(21) Appl. No.: 13/024,546

(22) Filed: Feb. 10, 2011

(65) Prior Publication Data
US 2012/0181699 A1    Jul. 19, 2012

Related U.S. Application Data

(60) Provisional application No. 61/434,234, filed on Jan. 19, 2011.

(51) Int. Cl.
*H01L 23/48* (2006.01)
(52) U.S. Cl. ........................................ 257/773; 438/618
(58) Field of Classification Search .................. 257/773; 438/618
See application file for complete search history.

(56) References Cited

U.S. PATENT DOCUMENTS

| 7,414,889 B2 | 8/2008 | Lue et al. |
| 7,529,137 B2 | 5/2009 | Lue et al. |
| 7,851,849 B2 | 12/2010 | Kiyotoshi |
| 2008/0073635 A1 | 3/2008 | Kiyotoshi et al. |
| 2010/0226195 A1 | 9/2010 | Lue |

OTHER PUBLICATIONS

Lue, H.T., et al.; "A Highly Scalable 8-Layer 3D Vertical-Gate (VG) TFT NAND Flash Using Junction-Free Buried Channel BE-SONOS Device;" Symposium on VLSI Technology Digest of Technical Papers; 2010; pp. 131-132.

*Primary Examiner* — Douglas Menz
(74) *Attorney, Agent, or Firm* — McClure, Qualey & Rodack LLP

(57) ABSTRACT

A semiconductor structure and a manufacturing method of the same are provided. The semiconductor structure includes a substrate, a first stacked structure, a second stacked structure, a dielectric element, and a conductive line. The first stacked structure and the second stacked structure are disposed on the substrate. Each of the first stacked structure and the second stacked structure includes conductive strips and insulating strips stacked alternately. The conductive strips are separated from each other by the insulating strips. The dielectric element is disposed on the first stacked structure and the second stacked structure and includes a second dielectric portion. The first stacked structure and the second stacked structure are separated from each other by only the second dielectric portion. The conductive line is disposed on the stack sidewalls of the first stacked structure and the second stacked structure far from the second dielectric portion.

22 Claims, 6 Drawing Sheets

SEMICONDUCTOR STRUCTURE AND MANUFACTURING METHOD OF THE SAME

This application claims the benefit of U.S. provisional application Ser. No. 61/434,234, filed Jan. 19, 2011, the subject matter of which is incorporated herein by reference.

BACKGROUND

1. Technical Field

The disclosure relates in general to a semiconductor structure and a manufacturing method of the same and more particularly to a memory device and a manufacturing method of the same.

2. Description of the Related Art

Memory devices are used in storage elements for many products such as MP3 players, digital cameras, computer files, etc. As the application increases, the demand for the memory device focuses on small size and large memory capacity. For satisfying the requirement, a memory having a high element density is need.

Designers have developed a method for improving a memory device density, using 3D stack memory device so as to increase a memory capacity and a cost per cell. However, the scaling limitation of a memory cell size of this kind of the memory device is still bigger than 50 nm. It is not easy to breakthrough the limitation.

SUMMARY

A semiconductor structure is provided. The semiconductor structure comprises a substrate, a first stacked structure, a second stacked structure, a dielectric element, and a conductive line. The first stacked structure and the second stacked structure are disposed on the substrate. Each of the first stacked structure and the second stacked structure comprises conductive strips and insulating strips stacked alternately. The conductive strips are separated from each other by the insulating strips. The dielectric element is disposed on the first stacked structure and the second stacked structure and comprises a second dielectric portion. The first stacked structure and the second stacked structure are separated from each other by only the second dielectric portion. The conductive line is disposed on the stack sidewalls of the first stacked structure and the second stacked structure far from the second dielectric portion. The dielectric element is between the conductive line and the first stacked structure and is between the conductive line and the second stacked structure.

A method for manufacturing a semiconductor structure is provided. The method comprises following steps. A first stacked structure and a second stacked structure are formed on a substrate. Each of the first stacked structure and the second stacked structure comprises conductive strips and insulating strips stacked alternately. The conductive strips are separated from each other by the insulating strips. A dielectric element comprising a second dielectric portion is formed on the first stacked structure and the second stacked structure. The first stacked structure and the second stacked structure are separated from each other by only the second dielectric portion.

The following description is made with reference to the accompanying drawings.

DETAILED DESCRIPTION

Embodiments of the present disclosure relate to a semiconductor structure and a method for manufacturing the same. The semiconductor has a small feature size.

Figure 1:
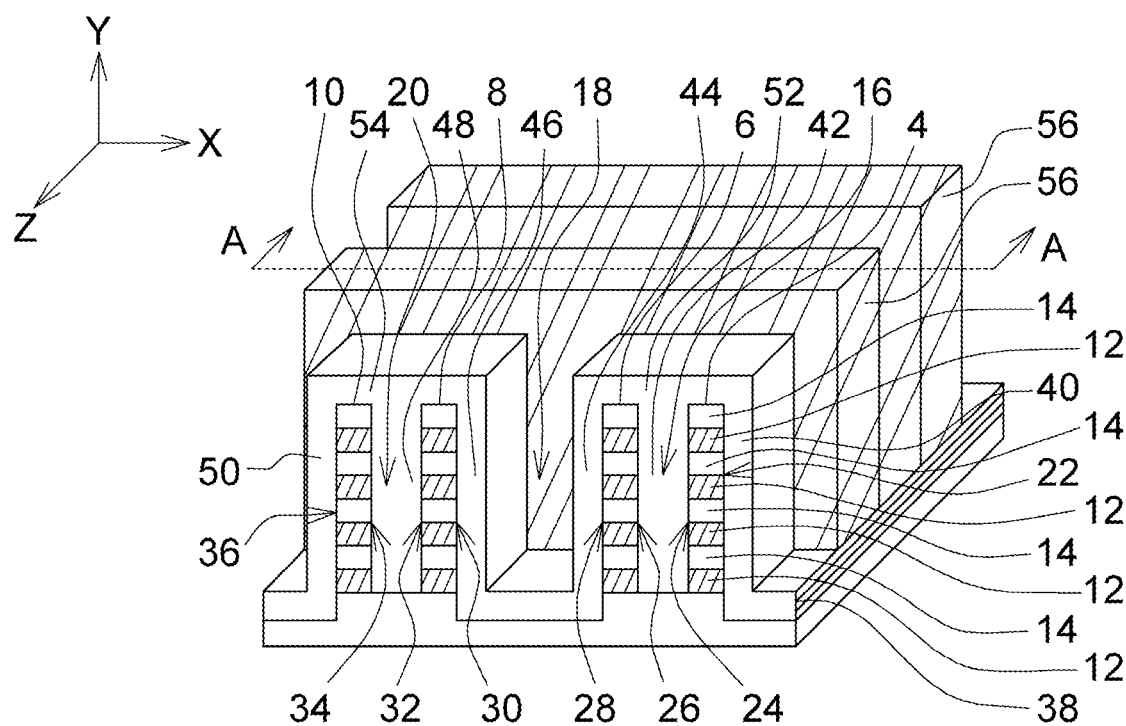
FIG. 1 shows a three dimensional view of a semiconductor structure in one embodiment.
Figure 2:
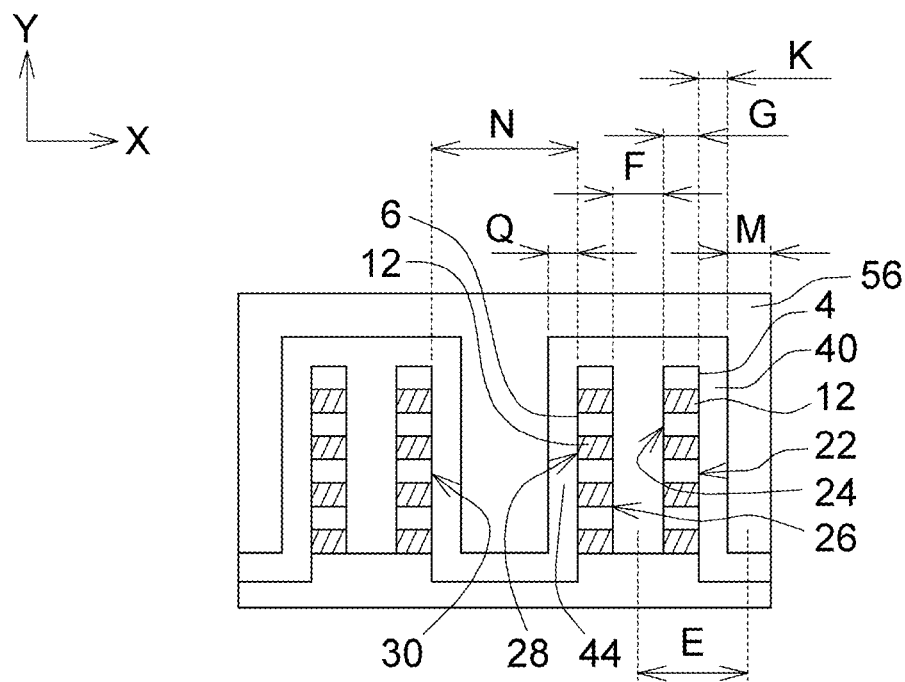
FIG. 2 is a cross-sectional view of a semiconductor structure.

FIG. 1 shows a three dimensional view of the semiconductor structure in one embodiment. FIG. 2 is a cross-sectional view of the semiconductor structure along AA line in FIG. 1. In embodiments, the semiconductor structure is a 3D vertical gate memory device, for example, comprising a NAND flash memory and an anti-fuse memory, etc.

Referring to FIG. 1, the semiconductor structure comprises a substrate 2. A first stacked structure 4, a second stacked structure 6, a third stacked structure 8 and a fourth stacked structure 10 are disposed on the substrate 2. Each of the first stacked structure 4, the second stacked structure 6, the third stacked structure 8 and the fourth stacked structure 10 comprises conductive strips 12 and insulating strips 14 stacked alternately. The conductive strips 12 are separated from each other by the insulating strips 14. The insulating strip 14 may comprise oxide such as silicon oxide. The conductive strip 12 may comprise metal or semiconductor such as P-type polysilicon. In one embodiment, the conductive strips 12 of different layers act as bit lines (BL) of memory cells of different planes.

The first stacked structure 4 and the second stacked structure 6 have a first space 16 therebetween. The second stacked structure 6 and the third stacked structure 8 have a second space 18 therebetween. The third stacked structure 8 and the fourth stacked structure 10 have a third space 20 therebetween. The first stacked structure 4 comprises opposite a first stack sidewall 22 and a second stack sidewall 24. The second stacked structure 6 comprises opposite a third stack sidewall 26 and a fourth stack sidewall 28. The third stacked structure 8 comprises opposite a fifth stack sidewall 30 and a sixth stack sidewall 32. The fourth stacked structure 10 comprises opposite a seventh stack sidewall 34 and an eighth stack sidewall 36. The first stack sidewall 22 and the fourth stack sidewall 28 are far from the first space 16. The second stack sidewall 24 and the third stack sidewall 26 are adjacent to the first space 16. The fourth stack sidewall 28 and the fifth stack sidewall 30 are adjacent to the second space 18. The third stack sidewall 26 and the sixth stack sidewall 32 are far from the second space 18. The sixth stack sidewall 32 and the seventh stack sidewall 34 are adjacent to the third space 20. The fifth stack sidewall 30 and the eighth stack sidewall 36 are far from the third space 20.

Referring to FIG. 1, a dielectric element 38 may be disposed on the first stacked structure 4, the second stacked structure 6, the third stacked structure 8 and the fourth stacked structure 10. For example, the dielectric element 38 comprises a first dielectric portion 40, a second dielectric portion 42, a third dielectric portion 44, a fourth dielectric portion 46, a fifth dielectric portion 48, a sixth dielectric portion 50, a seventh dielectric portion 52 and a eighth dielectric portion 54. The first dielectric portion 40 is disposed on the first stack sidewall 22. The second dielectric portion 42 is disposed in the first space 16. The third dielectric portion 44 is disposed on the fourth stack sidewall 28. The fourth dielectric portion 46 is disposed on the fifth stack sidewall 30. The fifth dielectric portion 48 is disposed in the third space 20. The sixth dielectric portion 50 is disposed on the eighth stack sidewall 36. The seventh dielectric portion 52 is disposed on the upper surfaces of the first stacked structure 4 and the second stacked structure 6. The eighth dielectric portion 54 is disposed on the upper surfaces of the third stacked structure 8 and the fourth stacked structure 10.

Referring to FIG. 1, conductive lines 56 are disposed on the dielectric element 38. For example, the conductive line 56 is disposed in the second space 18 and between the third dielectric portion 44 and the fourth dielectric portion 46. The first dielectric portion 40 is disposed between the first stacked structure 4 and the conductive line 56. The third dielectric portion 44 is disposed between the second stacked structure 6 and the conductive line 56. The fourth dielectric portion 46 is disposed between the third stacked structure 8 and the conductive line 56. The sixth dielectric portion 50 is disposed between the fourth stacked structure 10 and the conductive line 56. In one embodiment, the conductive lines 56 act as a word lines (WL). The conductive line 56 may comprise metal or semiconductor such as P+ type polysilicon. Moreover, referring to FIG. 1, the first stacked structure 4 and the second stacked structure 6 are separated from each other by only the second dielectric portion 42. The third stacked structure 8 and the fourth stacked structure 10 are separated from each other by only the fifth dielectric portion 48. The memory cell has an asymmetrical structure. Thus, the feature size (in X-direction) of the memory cell can be reduced. For example, referring to FIG. 2, the half pitch E (in X-direction) of the asymmetrical vertical gate can be scaled down to below about 18 nm. Therefore, the semiconductor structure has a high element density.

In one embodiment, for example, a distance F between the second stack sidewall 24 of the first stacked structure 4 and the third stack sidewall 26 of the second stacked structure 6 is about 15 nm. A thickness G of the conductive strip 12 of the first stacked structure 4 is about 10 nm. A thickness K of the first dielectric portion 40 on the first stack sidewall 22 of the first stacked structure 4 is about 15 nm. A thickness M of the conductive line 56 on the first dielectric portion 40 is about 10 nm. In other embodiments, for example, a distance F between the second stack sidewall 24 and the third stack sidewall 26 may be smaller than a distance N between the fourth stack sidewall 28 and the fifth stack sidewall 30. The distance F may be smaller than twice times a thickness Q of the third dielectric portion 44 (i.e F<2*Q). The distance F may be bigger than half times the thickness Q (i.e F>Q/2). The distance F may be smaller than or equal to 30 nm. The distance N may be bigger than or equal to 30 nm. The thickness Q may be bigger than 12 nm. In some embodiments, the distance F is 16 nm. The distance N is 24 nm. The thickness Q is 14 nm. In one embodiment, the drain side of the 3D vertical gate memory device has a diode design. In addition, the source side has layers pickup for each other. In other embodiments, the source side has a diode design. In addition, the drain side has layers pickup for each layer.

Referring to FIG. 1, the dielectric element 38 may have a single dielectric material. In other words, each of the first dielectric portion 40, the second dielectric portion 42, the third dielectric portion 44, the fourth dielectric portion 46, the fifth dielectric portion 48, the sixth dielectric portion 50, the seventh dielectric portion 52 and the eighth dielectric portion 54 has a single dielectric material. In one embodiment, the dielectric element 38 acts as an anti-fuse memory layer and is constructed by an anti-fuse material, for example, comprising oxide such as silicon oxide, or nitride such as silicon nitride.

Figure 3:
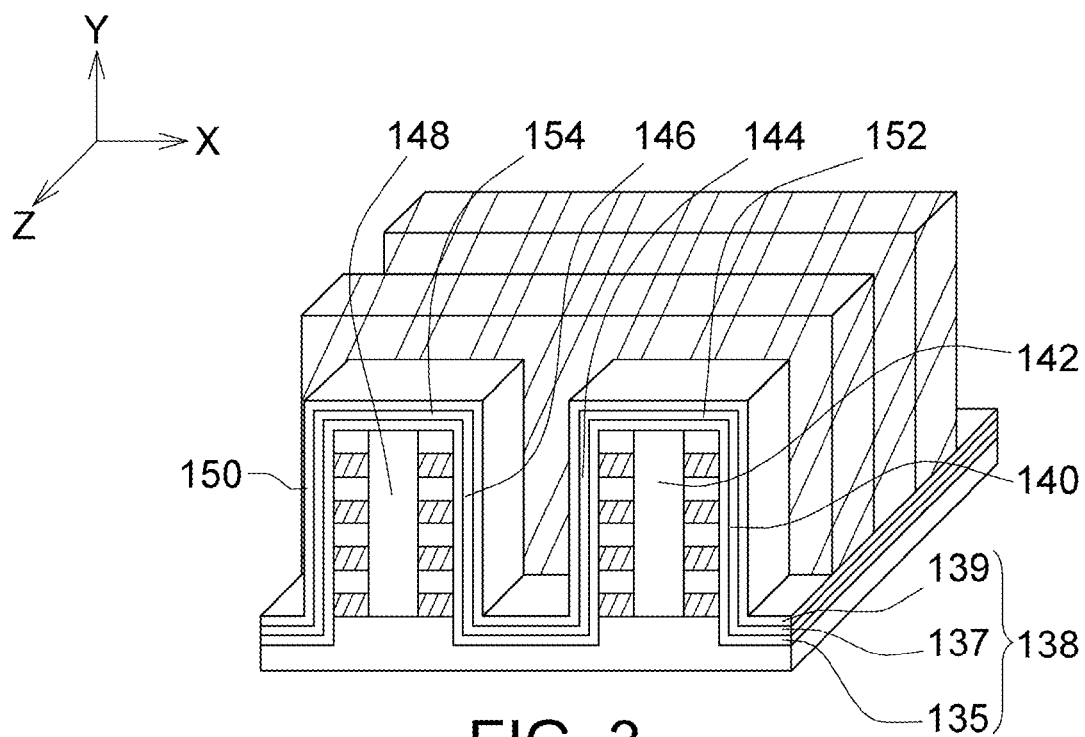
FIG. 3 shows a semiconductor structure in one embodiment.

FIG. 3 shows the semiconductor structure in other embodiments. The semiconductor structure of FIG. 3 is different from the semiconductor structure of FIG. 1 in that, in the dielectric element 138, the second dielectric portion 142 and the fifth dielectric portion 148 have a single dielectric material, comprising oxide such as silicon oxide; and each of the first dielectric portion 140, the third dielectric portion 144, the fourth dielectric portion 146, the sixth dielectric portion 150, the seventh dielectric portion 152 and the eighth dielectric portion 154 has a multi-layer structure constructed by, for example, dielectric layers 135,137, 139 of various dielectric materials comprising, for example, oxide such as silicon oxide, or nitride such as silicon nitride. In one embodiment, the dielectric layers 135 and 139 have silicon oxide. The dielectric layer 137 has silicon nitride. The dielectric layers 135,137 and 139 construct an ONO multi-layer structure. For example, the thickness of the dielectric layer 135 may be 5 nm-10 nm. The thickness of the dielectric layer 137 may be 5 nm-10 nm. The thickness of the dielectric layer 139 may be 5 nm-12 nm. In one embodiment, the dielectric layer 137 acts as a charge storage layer.

Figure 4:
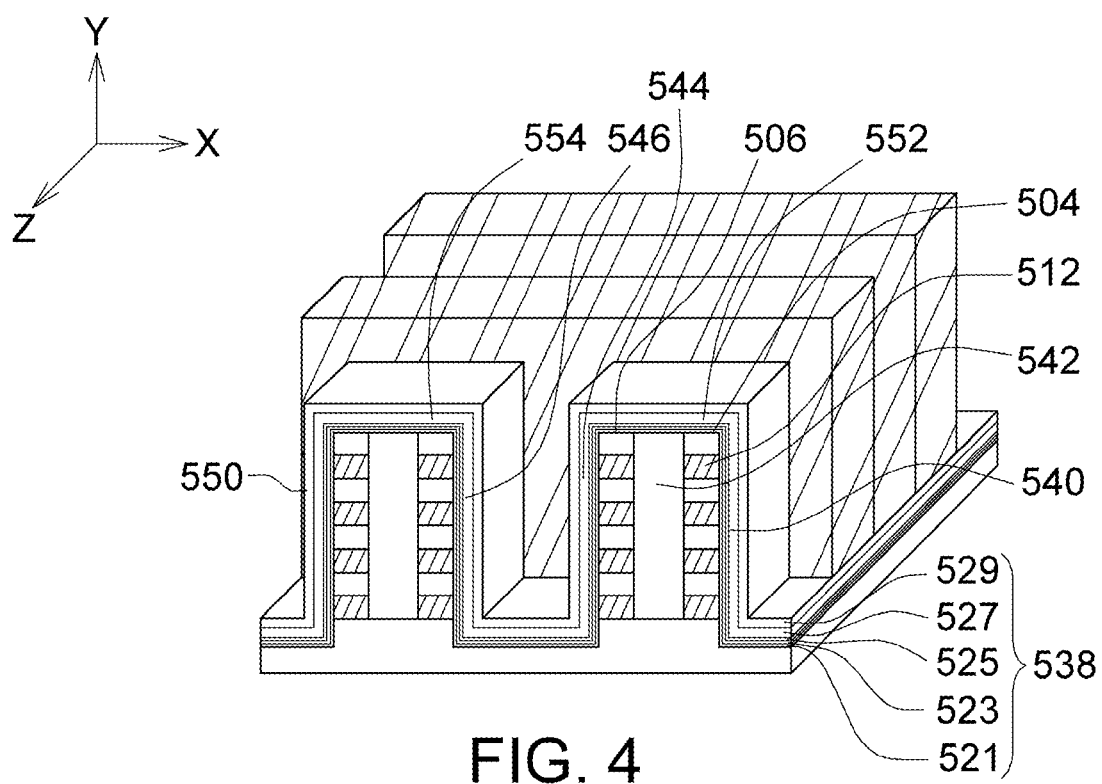
FIG. 4 shows a semiconductor structure in one embodiment.

FIG. 4 shows the semiconductor structure in one embodiment. The semiconductor structure of FIG. 4 is different from the semiconductor structure of FIG. 3 in that, in the dielectric element 538, each of the first dielectric portion 540, the third dielectric portion 544, the fourth dielectric portion 546, the sixth dielectric portion 550, the seventh dielectric portion 552 and the eighth dielectric portion 554 has an ONONO structure, constructed by the dielectric layers 521, 525 and 529 which may be silicon oxide and the dielectric layers 523 and 525 which may be silicon nitride. In addition, the thicknesses of the dielectric layers 521, 523, 525 are smaller than the thicknesses of the dielectric layers 527, 529. For example, the thicknesses of the dielectric layers 521, 523, 525 may be 1 nm-3 nm, respectively. The thickness of the dielectric layer 527 may be 5 nm-10 nm. The thickness of the dielectric layer 529 may be 5 nm-12 nm. In one embodiment, the dielectric layers 521, 523 and 525 act as a hole-tunneling structure. The dielectric layer 527 acts as a charge storage layer. The dielectric layer 523 acts as a tunneling dielectric layer.

Referring to FIG. 4, for example, a gap between the conductive strips 512 (acting as bit lines) of the first stacked structure 504 and the second stacked structure 506 (in this case, which also may regard as the thickness of the second dielectric portion 542) at least equals to the thickness of the third dielectric portion 544 (having the ONONO structure) or the thickness of the seventh dielectric portion 552 (having the ONONO structure) so as to avoid too much coupling capacitance between the adjacent conductive strips 512.

Figure 5:
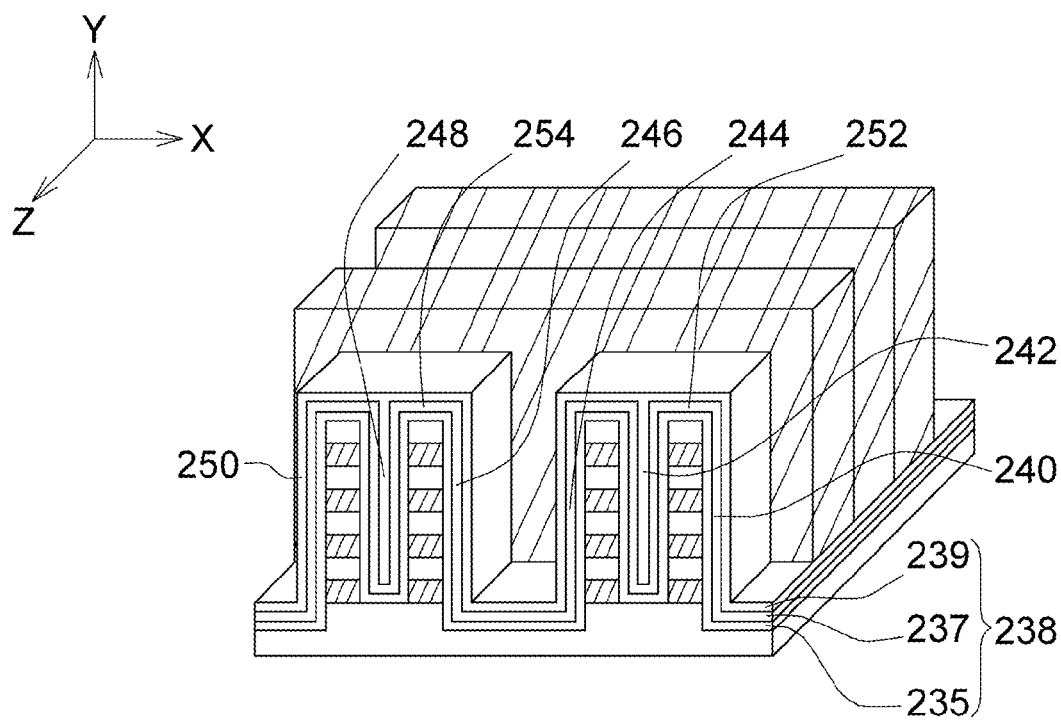
FIG. 5 shows a semiconductor structure in one embodiment.

FIG. 5 shows the semiconductor structure in one embodiment. The semiconductor structure of FIG. 5 is different from the semiconductor structure of FIG. 1 in that the dielectric element 238 is constructed by various dielectric materials. For example, each of the first dielectric portion 240, the third dielectric portion 244, the fourth dielectric portion 246, the sixth dielectric portion 250, the seventh dielectric portion 252 and the eighth dielectric portion 254 has a multi-layer structure constructed by dielectric layers 235, 237, 239. In one embodiment, the dielectric layers 235 and 239 have silicon oxide. The dielectric layer 237 has silicon nitride. The dielectric layers 235, 237 and 239 construct an ONO multi-layer structure. The second dielectric portion 242 and the fifth dielectric portion 248 are also constructed by the various dielectric materials that the dielectric layers 235,237 and 239 have.

Figure 6:
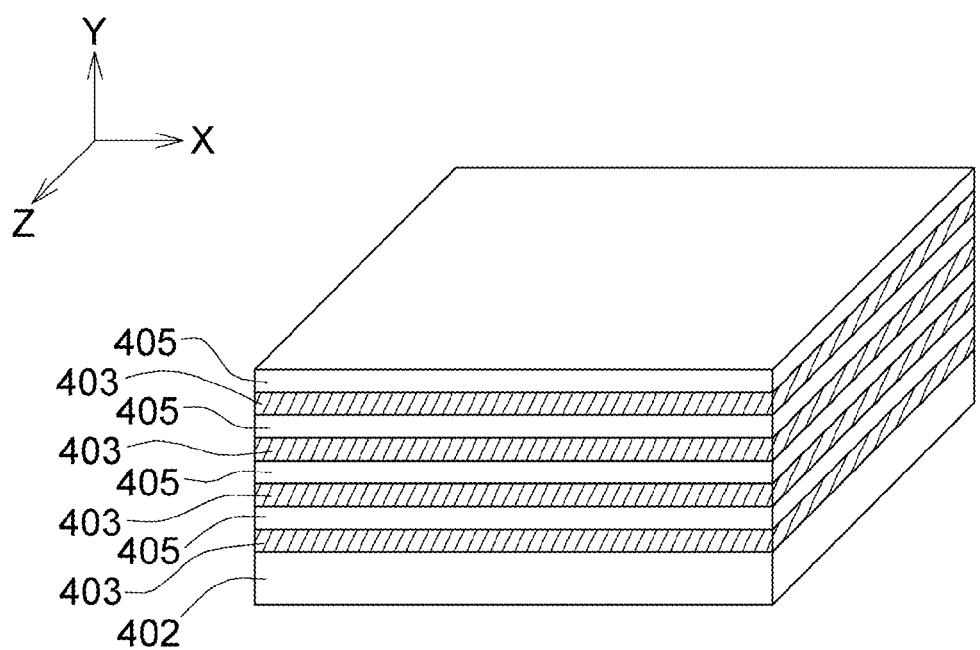
FIG. 6 to FIG. 12 illustrate a method for manufacturing a semiconductor structure in one embodiment.

FIG. 6 to FIG. 12 illustrate a method for manufacturing the semiconductor structure in one embodiment. Referring to FIG. 6, conductive layers 403 and insulating layers 405 are stacked alternately on the substrate 402. The conductive layers 403 are separated from each other by the insulating layer 405. The conductive layers 403 are insulated from the substrate 402. The substrate 402 may comprise oxide such as silicon oxide. The substrate 402 may also comprise silicon and be insulated from the conductive layer 403 by a dielectric layer (not shown).

Figure 7:
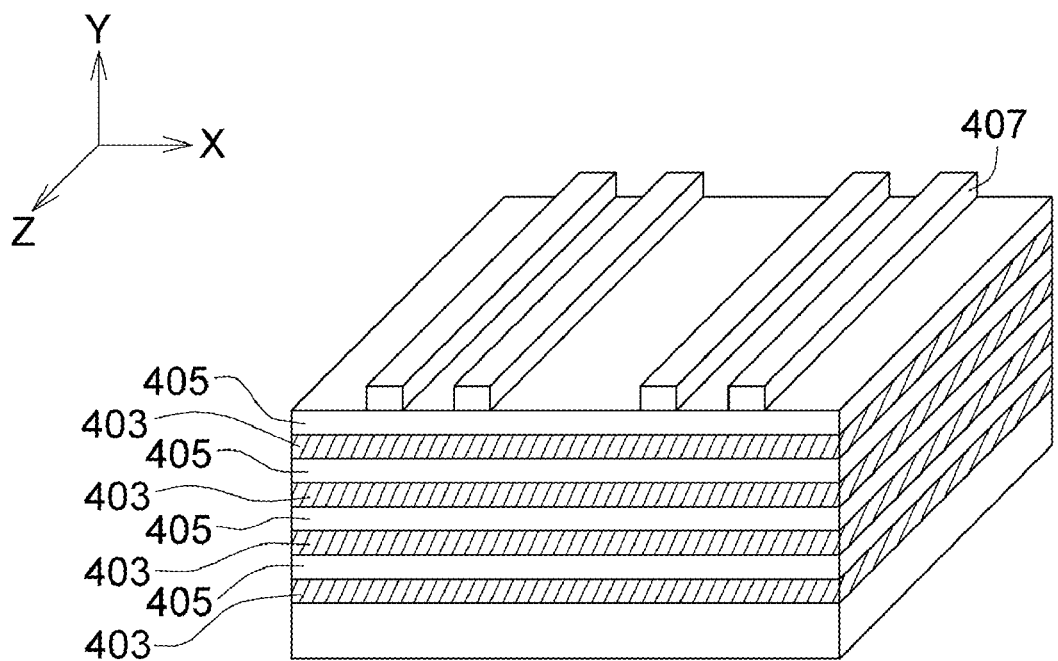
Figure 8:
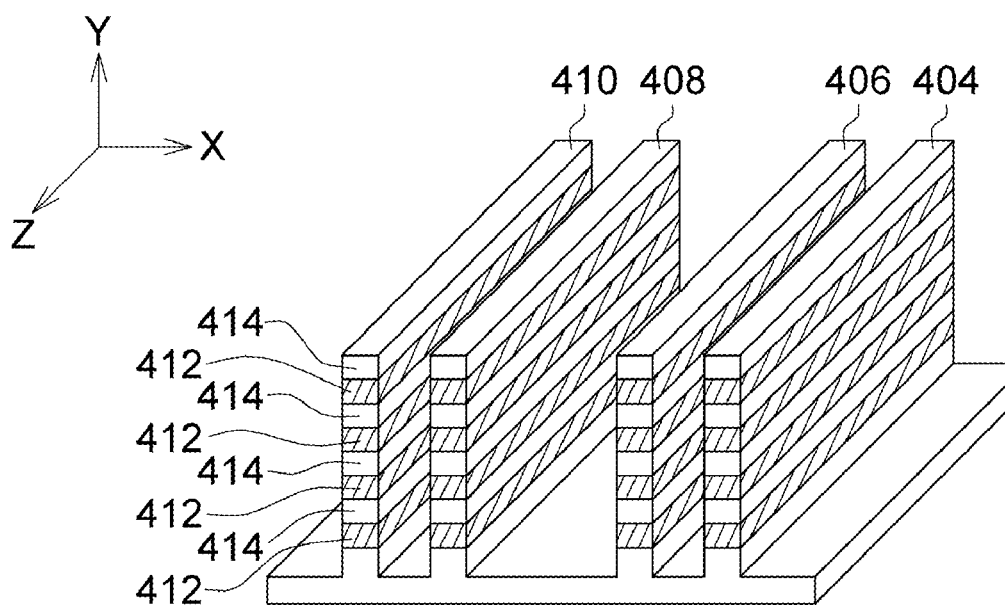
Figure 9:
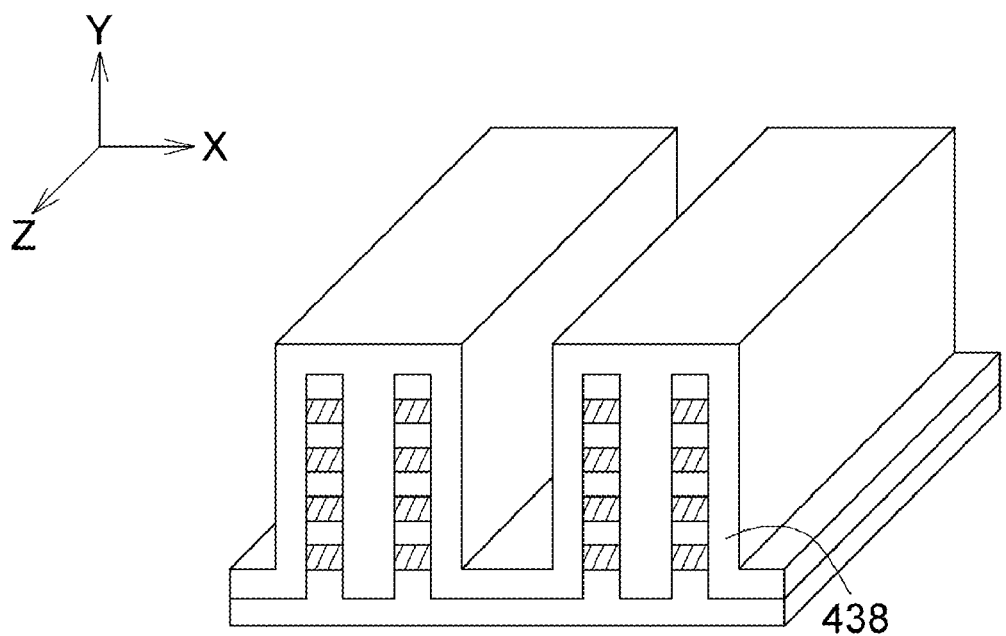
Figure 10:
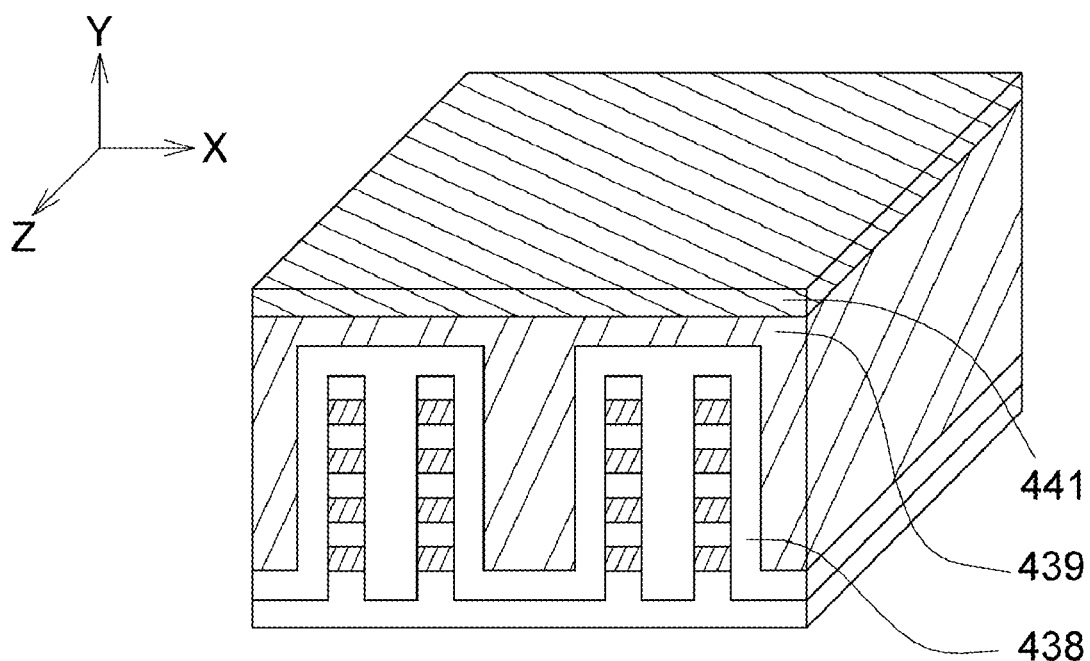
Figure 11:
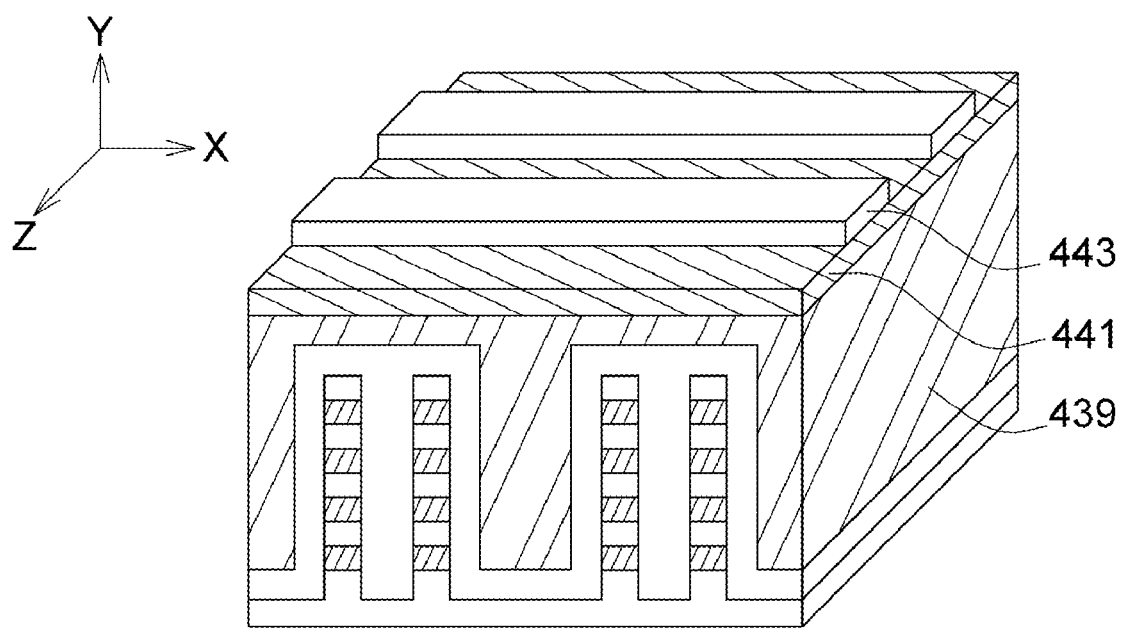
Figure 12:
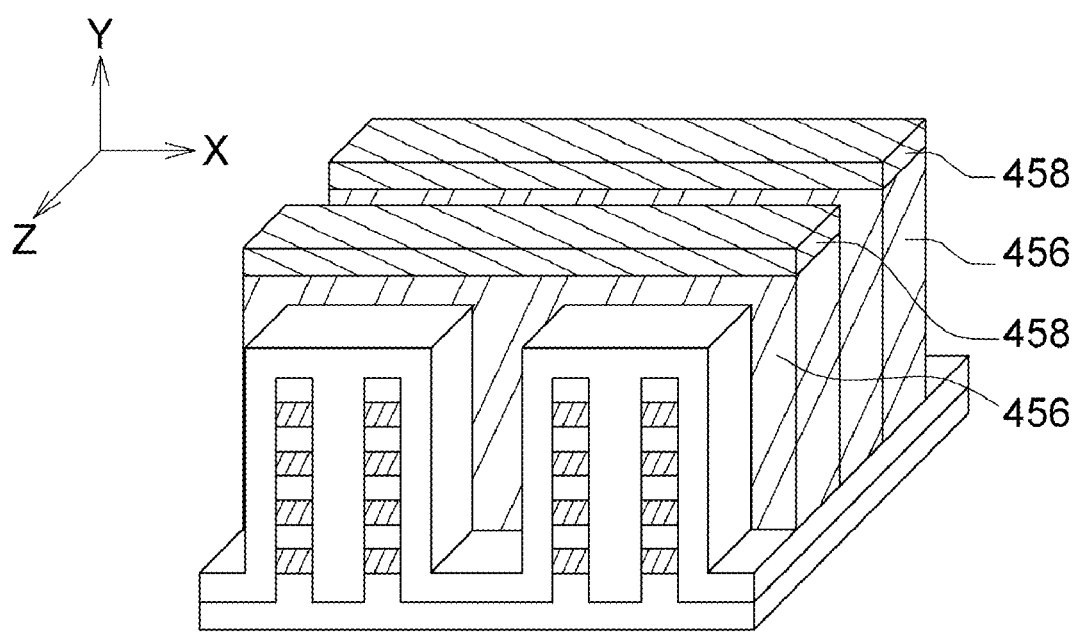

Referring to FIG. 7, a mask layer 407 is formed on the stacked conductive layers 403 and insulating layers 405. A portion of the conductive layers 403 and the insulating layers 405 not covered by the mask layer 407 is removed for forming the first stacked structure 404, the second stacked structure 406, the third stacked structure 408 and the fourth stacked structure 410 as shown in FIG. 8. Each of the first stacked structure 404, the second stacked structure 406, the third stacked structure 408 and the fourth stacked structure 410 comprises the conductive strips 412 and the insulating strips 414 stacked alternately Referring to FIG. 9, the dielectric element 438 is formed on the first stacked structure 404, the second stacked structure 406, the third stacked structure 408 and the fourth stacked structure 410. Referring to FIG. 10, a conductive material 439 is formed on the dielectric element 438. A contact material 441 may be formed on the conductive material 439. In one embodiment, the conductive material 439 comprises, for example, P+ type polysilicon. The contact material 441 comprises metal silicide such as WSi. Referring to FIG. 11, a patterned mask layer 443 is formed on the contact material 441. A portion of the conductive material 439 and the contact material 441 not covered by the mask layer 443 for forming the conductive lines 456 and contact structures 458.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
a substrate;
a first stacked structure and a second stacked structure disposed on the substrate, wherein
each of the first stacked structure and the second stacked structure comprises conductive strips and insulating strips stacked alternately, the conductive strips are separated from each other by the insulating strips;
a dielectric element disposed on the a first stacked structure and a second stacked structure and comprising a second dielectric portion, wherein the first stacked structure and the second stacked structure are separated from each other by only the second dielectric portion; and
a conductive line disposed on the stack sidewalls of the first stacked structure and the second stacked structure far from the second dielectric portion, wherein the dielectric element is between the conductive line and the first stacked structure and is between the conductive line and the second stacked structure.

2. The semiconductor structure according to claim 1, wherein the conductive line acts as a word line, the conductive strips of the first stacked structure and the second stacked structure act as bit lines.

3. The semiconductor structure according to claim 1, wherein,
the first stacked structure and the second stacked structure have a first space therebetween,
the first stacked structure comprises opposite a first stack sidewall and a second stack sidewall,
the second stacked structure comprises opposite a third stack sidewall and a fourth stack sidewall,
the first stack sidewall and the fourth stack sidewall are far from the first space, the second stack sidewall and the third stack sidewall are adjacent to the first space,
the dielectric element further comprises;
a first dielectric portion disposed on the first stack sidewall; and
a third dielectric portion disposed on the fourth stack sidewall,
wherein the second dielectric portion is disposed in the first space.

4. The semiconductor structure according to claim 3, wherein each of the first dielectric portion, the second dielectric portion and the third dielectric portion has a single dielectric material.

5. The semiconductor structure according to claim 3, wherein the second dielectric portion has a single dielectric material, each of the first dielectric portion and the third dielectric portion has a multi-layer structure constructed by various dielectric materials.

6. The semiconductor structure according to claim 3, wherein the second dielectric portion is constructed by various dielectric materials, each of the first dielectric portion and the third dielectric portion has a multi-layer structure constructed by the various dielectric materials.

7. The semiconductor structure according to claim 3, wherein the first dielectric portion is disposed between the first stacked structure and the conductive line, the third dielectric portion is disposed between the second stacked structure and the conductive line.

8. The semiconductor structure according to claim 7, wherein the conductive line acts as a word line, the conductive strips of the first stacked structure and the second stacked structure act as bit lines.

9. The semiconductor structure according to claim 3, further comprising a third stacked structure, wherein,
the second stacked structure and the third stacked structure have a second space therebetween,
the third stacked structure comprises opposite a fifth stack sidewall and a sixth stack sidewall,
the fourth stack sidewall and the fifth stack sidewall are adjacent to the second space, the third stack sidewall and the sixth stack sidewall are far from the second space,
the dielectric element further comprises a fourth dielectric portion disposed on the fifth stack sidewall,
the conductive line is disposed in the second space and between the third dielectric portion and the fourth dielectric portion.

10. The semiconductor structure according to claim 9, further comprising a fourth stacked structure, wherein,
the third stacked structure and the fourth stacked structure have a third space therebetween,
the fourth stacked structure comprises opposite a seventh stack sidewall and a eighth stack sidewall, the sixth stack sidewall an the seventh stack sidewall are adjacent to the third space, the fifth stack sidewall and the eighth stack sidewall are far from the third space, the dielectric element further comprises a fifth dielectric portion and a sixth dielectric portion, the fifth dielectric portion is disposed in the third space, the sixth dielectric portion is disposed on the eighth stack sidewall.

11. The semiconductor structure according to claim 10, wherein the sixth dielectric portion disposed between the fourth stacked structure and the conductive line.

12. The semiconductor structure according to claim 10, wherein the first dielectric portion, the second dielectric portion, the third dielectric portion, the fourth dielectric portion, the fifth dielectric portion and the sixth dielectric portion have a single dielectric material.

13. The semiconductor structure according to claim 10, wherein each of the second dielectric portion and the fifth dielectric portion has a single dielectric material, each of the first dielectric portion, the third dielectric portion, the fourth dielectric portion and the sixth dielectric portion has a multi-layer structure constructed by various dielectric materials.

14. The semiconductor structure according to claim 10, wherein each of the second dielectric portion and the fifth dielectric portion is constructed by various dielectric materials, each of the first dielectric portion, the third dielectric portion, the fourth dielectric portion and the sixth dielectric portion has a multi-layer structure constructed by the various dielectric materials.

15. The semiconductor structure according to claim 1, wherein the dielectric element comprises oxide or nitride.

16. A method for manufacturing a semiconductor structure, comprising:
    forming a first stacked structure and a second stacked structure on a substrate, wherein each of the first stacked structure and the second stacked structure comprises conductive strips and insulating strips stacked alternately, the conductive strips are separated from each other by the insulating strips; and
    forming a dielectric element on the first stacked structure and the second stacked structure, wherein the dielectric element comprises a second dielectric portion, the first stacked structure and the second stacked structure are separated from each other by only the second dielectric portion.

17. The method for manufacturing the semiconductor structure according to claim 16, further comprising forming a conductive line on the stack sidewalls of the first stacked structure and the second stacked structure far from the second dielectric portion, wherein the dielectric element is between the conductive line and the first stacked structure and is between the conductive line and the second stacked structure.

18. The method for manufacturing the semiconductor structure according to claim 16, wherein,
    the first stacked structure and the second stacked structure have a first space therebetween,
    the first stacked structure comprises opposite a first stack sidewall and a second stack sidewall,
    the second stacked structure comprises opposite a third stack sidewall and a fourth stack sidewall,
    the first stack sidewall and the fourth stack sidewall are far from the first space, the second stack sidewall and the third stack sidewall are adjacent to the first space,
    the dielectric element further comprises;
        a first dielectric portion disposed on the first stack sidewall; and
        a third dielectric portion disposed on the fourth stack sidewall,
    wherein the second dielectric portion is disposed in the first space.

19. The method for manufacturing the semiconductor structure according to claim 18, further comprising forming a conductive line, wherein the first dielectric portion is disposed between the first stacked structure and the conductive line, the third dielectric portion is disposed between the second stacked structure and the conductive line.

20. The method for manufacturing the semiconductor structure according to claim 18, further comprising:
    forming a third stacked structure; and
    forming a conductive line, wherein,
        the second stacked structure and the third stacked structure have a second space therebetween,
        the third stacked structure comprises opposite a fifth stack sidewall and a sixth stack sidewall,
        the fourth stack sidewall and the fifth stack sidewall are adjacent to the second space, the third stack sidewall and the sixth stack sidewall are far from the second space,
        the dielectric element further comprises a fourth dielectric portion disposed on the fifth stack sidewall,
        the conductive line is disposed in the second space and between the third dielectric portion and the fourth dielectric portion.

21. The method for manufacturing the semiconductor structure according to claim 20, further comprising forming a fourth stacked structure, wherein,
    the third stacked structure and the fourth stacked structure have a third space therebetween,
    the fourth stacked structure comprises opposite a seventh stack sidewall and a eighth stack sidewall,
    the sixth stack sidewall and the seventh stack sidewall are adjacent to the third space, the fifth stack sidewall and the eighth stack sidewall are far from the third space,
    the dielectric element further comprises a fifth dielectric portion and a sixth dielectric portion, the fifth dielectric portion is disposed in the third space, the sixth dielectric portion is disposed on the eighth stack sidewall.

22. The method for manufacturing the semiconductor structure according to claim 21, wherein the sixth dielectric portion is disposed between the fourth stacked structure and the conductive line.

* * * * *